United States Patent [19]

Stewart et al.

[11] 4,107,556
[45] Aug. 15, 1978

[54] SENSE CIRCUIT EMPLOYING COMPLEMENTARY FIELD EFFECT TRANSISTORS

[75] Inventors: Roger Green Stewart, Neshanic Station; Sargent Sheffield Eaton, Jr., Phillipsburg, both of N.J.

[73] Assignee: RCA Corporation, New York, N.Y.

[21] Appl. No.: 796,334

[22] Filed: May 12, 1977

[51] Int. Cl.² .................... H03K 5/18; G11C 7/06; H03K 3/353; H03K 3/286
[52] U.S. Cl. ................. 307/362; 307/200 B; 307/279; 307/355; 307/DIG. 3; 365/196; 365/202; 365/205
[58] Field of Search ............... 307/238, 279, 288, 291, 307/355, 362, 363, DIG. 3, 200 B; 365/205, 196, 190, 189

[56] References Cited

U.S. PATENT DOCUMENTS

| | | | |
|---|---|---|---|
| 3,868,656 | 2/1975 | Stein et al. | 307/279 X |
| 3,879,621 | 4/1975 | Cavaliere | 307/DIG. 3 X |
| 3,983,543 | 9/1976 | Cordaro | 307/DIG. 3 X |
| 3,983,544 | 9/1976 | Dennison et al. | 307/DIG. 3 X |
| 3,983,545 | 9/1976 | Cordaro | 307/279 X |
| 3,992,704 | 11/1976 | Kantz | 307/DIG. 3 X |

OTHER PUBLICATIONS

Lohman, "Applications of MOSFETs in Microelectronics", SCP & Solid-State Technology (pub.); pp. 23-29; Mar. 1966.

Primary Examiner—Larry N. Anagnos
Attorney, Agent, or Firm—H. Christoffersen; Henry I. Schanzer

[57] ABSTRACT

A sense circuit suitable for use with semiconductor memory arrays which, in contrast to sense circuits of similar type, exhibits no voltage offset in the latched condition between the input-output (I/O) nodes and the supply lines. The sense circuit includes first and second complementary inverters with inputs connected to first and second I/O nodes, respectively, and with outputs capable of being clamped to one or the other of the two supply lines powering the inverters. Selectively and sequentially enabled cross-coupling transmission gates are connected between the output of each inverter and the input to the other inverter, and selectively enabled biasing transmission gates are connected between the input and output of each inverter. In the operation of the circuit, the two input nodes are first precharged to a predetermined value by enabling the biasing gates. A signal is then applied to one I/O node causing its potential to vary from its quiescent value. Then, the cross-coupling gate connected to the output of the inverter whose input is connected to the one I/O node is first enabled and, subsequently, the other cross-coupling gate is enabled. When the two cross-coupling gates are enabled, the inverters are latched and form a flip flop with the first I/O node clamped to the supply line having the same binary signal and the second I/O node clamped to the other power supply line.

8 Claims, 3 Drawing Figures

SENSE CIRCUIT EMPLOYING COMPLEMENTARY FIELD EFFECT TRANSISTORS

FIELD OF THE INVENTION

This invention relates to sense circuits, suitable for use with semiconductor memory arrays and, in particular, to a sense circuit capable of sensing a small input signal on one of its input-output (I/O) lines and which, in response thereto, is capable of clamping that one of its I/O lines via a low impedance path to that one of the two power supply lines powering the sense circuit having the same binary significance as the input signal.

BRIEF DESCRIPTION OF THE DRAWINGS

In the accompanying drawings, like reference characters denote like components and.

BACKGROUND OF THE INVENTION

Figure 1:
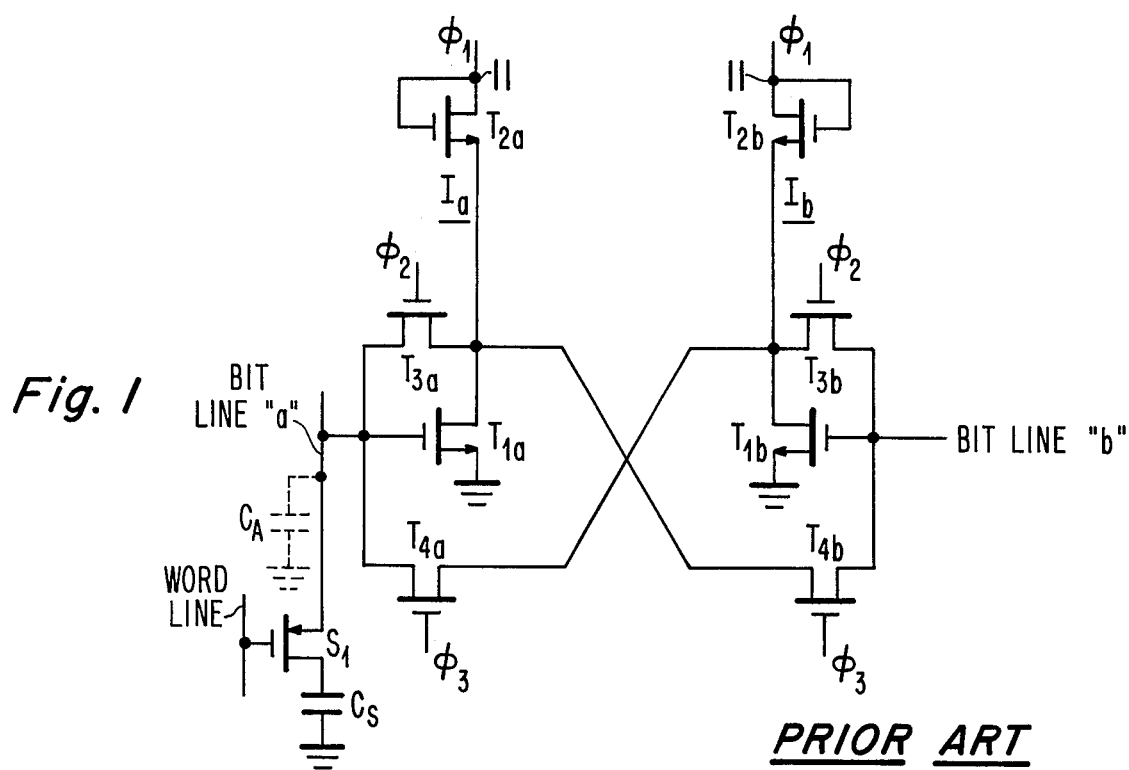
FIG. 1 is a schematic diagram of a prior art sense circuit.

The memory cells of high density semiconductor memory arrays produce relatively small signals when read out. For example, a high density dynamic memory may include a storage capacitor ($C_S$) and a series connected switching transistor at each bit location. When a bit is read out, $C_S$ is coupled via the switching transistor to a bit line connected to the input of a sense amplifier. $C_S$ is then placed in parallel with the capacitance ($C_A$) associated with the bit line and the amplifier input, and the charge originally across $C_S$ is redistributed between $C_S$ and $C_A$. Since $C_A$ is normally two or three orders of magnitude greater than $C_S$, the signal voltage originally present across $C_S$ is greatly attenuated. Assume, for example, that $C_S$ and $C_A$ have values of C, and 10C, respectively, and that prior to read out, $C_S$ was either at zero volts or at $+V$ volts and $C_A$ was at V/2 volts. After read out the voltage across $C_S$ and $C_A$ will be approximately $[V/2 \pm \Delta V]$ volts where $\Delta V$ is approximately equal to V/20. Therefore, the voltage across $C_S$ is altered from $+V$ volts to $[V/2 + \Delta V]$ volts or from zero volts to $V/2 - \Delta V$. The alteration of the signal originally present across $C_S$ amounts to destructive read out and is unacceptable in typical random access memories (RAMs). A sense circuit is, therefore, needed which can read the small signal ($\Delta V$) produced when a memory cell is read out and write back into the cell its original contents.

A sense circuit which attempts to do that is described in an article titled "A 1-mil$^2$ Single-Transistor Memory Cell in N-Silicon-Gate Technology" by K. U. Stein and H. Friedrich, published in the 1973 Digest of Technical Papers of the ISSCC at pages 30, 31 and 195. Circuit 2 shown at page 195 of the cited reference is redrawn, with minor modification and the addition of reference numerals, as FIG. 1 labelled prior art. The prior art sense circuit has many advantages, but, as discussed below, it does not restore the full levels read out of the cell being sensed.

The sense circuit of FIG. 1 includes two inverters ($I_a$ and $I_b$), two biasing gates (T3a, T3b), and two cross-coupling gates (T4a, T4b), all of which employ transistors of the same conductivity type. Each inverter includes an active transistor (T1a, T1b) and a load transistor (T2a, T2b). The output of each inverter is at the connection of the drain of the active transistor and the source of the load transistor and the input of each inverter is at the gate of each active transistor. A memory cell comprising a capacitor $C_S$ is shown connected via transistor S1 to the bit line "a" connected to the input of inverter $I_a$ having a capacitance $C_A$.

The operation of the circuit in the sense mode is briefly as follows. Assume that, prior to data read out, bit lines "a" and "b" are precharged to V/2 volts by momentarily enabling transistors T3a and T3b and by applying $+V$ volts to the drains of transistor T2a, T2b. Assume, as above, that $C_A$ is 10 times $C_S$, that the contents of $C_S$ are read out onto bit line $a$ by turning on $S_1$, that upon read out the voltage ($V_A$) on bit line $a$ goes either to $[V/2 + \Delta V]$ for $C_S$ initially at $+V$ volts (defined as storing a logic "1") or to $[V/2 - \Delta V]$ for $C_S$ initially at zero volts (defined as storing a logic "0"), and that while $C_S$ is being read out, bit line $b$ remains charged to the quiescent value of V/2.

Following read out of $C_S$, gates T4a and T4b are enabled when a signal $\phi 3$ applied to their gate goes positive (assume from 0 volts to $+V$ volts). Inverters $I_a$ and $I_b$ are then cross coupled and are driven to either one of two states.

When a logic "1" is read out from $C_S$ onto bit line $a$, the output of inverter $I_a$ goes low turning off transistor T1b while the output of inverter $I_b$ goes "high" turning on transistor T2b. However, transistor T2b conducts in the source follower mode and the potential at its source, which is also the output of inverter $I_b$, can not go above V volts (its assumed drain voltage) minus $V_T$ volts which is the threshold voltage of transistor T2b. Furthermore, transistor T4a which couples the output of inverter Ib back to bit line "a" also conducts in the source follower mode. Thus, the potential fed back to node "a" will be less than $[V - V_T]$ volts. Hence, the rewrite or restore voltage at bit line "a" is less than the original value of voltage across $C_S$. Some of the original signal amplitude has been lost and if the cell is to be sensed again, its output voltage may be too low to produce a "readable" signal.

When a logic "0" is read out from $C_S$, the output of inverter $I_a$ goes "high" turning on transistor T1b, while the output of inverter $I_b$ goes "low" turning off transistor T1a. However, when transistor T1b is turned on, its load transistor T2b is also still turned on. The conduction paths of transistors T1b and T2b are connected in series between V volts and ground and form a voltage divider. For the output of inverter $I_b$ to be clamped close to ground, the impedance of transistor T2b must be much greater than that of T1b. But, making the impedance of T2b large slows down the operation of the circuit, while making the impedance of T1b small increases the power dissipation of the circuit. An additional constraint exists since the ratio of the impedances of T1b and T2b must satisfy the requirements for setting the quiescent levels during precharge. Thus, the generation of a "low" level at, or close to, ground potential is difficult if not impossible to obtain. The low level fed back to bit line "a" is more positive than its original low value and again some of the signal is lost.

In brief, following read out, the sense circuit is used to rewrite or restore information to the interrogated memory cell. However, with the prior art circuit, the full high level is not available due to the $V_T$ drop of a transistor operated in the source follower mode and the full low level is difficult to obtain due to conflicting design requirements. To enable the writing back into a sensed cell of a full "high" level or a full "low" level, it is desirable that the outputs of the inverters be clamped via low impedance paths to either the positive supply line or the negative supply line. This is desirable in order to prevent noise pick up on the lines. Accordingly, circuits embodying the invention include complementary inverters whose outputs can be clamped to either one of two power supply lines powering the inverters.

SUMMARY OF THE INVENTION

Sense circuits embodying the invention include first and second inverters connected at their inputs to first and second nodes, respectively. Each inverter is connected at its output via a selectively enabled cross-coupling transmission gate to the input of the other inverter. A selectively enabled biasing transmission gate is connected between the input and the output of each inverter for selectively biasing the inverter input to the voltage at its output. The inverters include devices of complementary conductivity type to clamp the output to the power supply lines.

The sense circuit has a precharge mode, a sense mode, and a latch mode. During the precharge mode, the first and second nodes are charged to voltages corresponding to the inverter quiescent points. During the sense mode, first and second signals are applied to the first and second nodes, respectively, causing the inverter outputs to vary from their quiescent values. During the latch mode, the inverters are cross coupled forming a flip flop which is set to the state dictated by the sense of the difference in the signals applied to said first and second nodes. The output of one inverter is clamped to the first voltage and the output of the other inverter is clamped to the second voltage.

DETAILED DESCRIPTION OF THE DRAWING OF THE INVENTION

Figure 2:
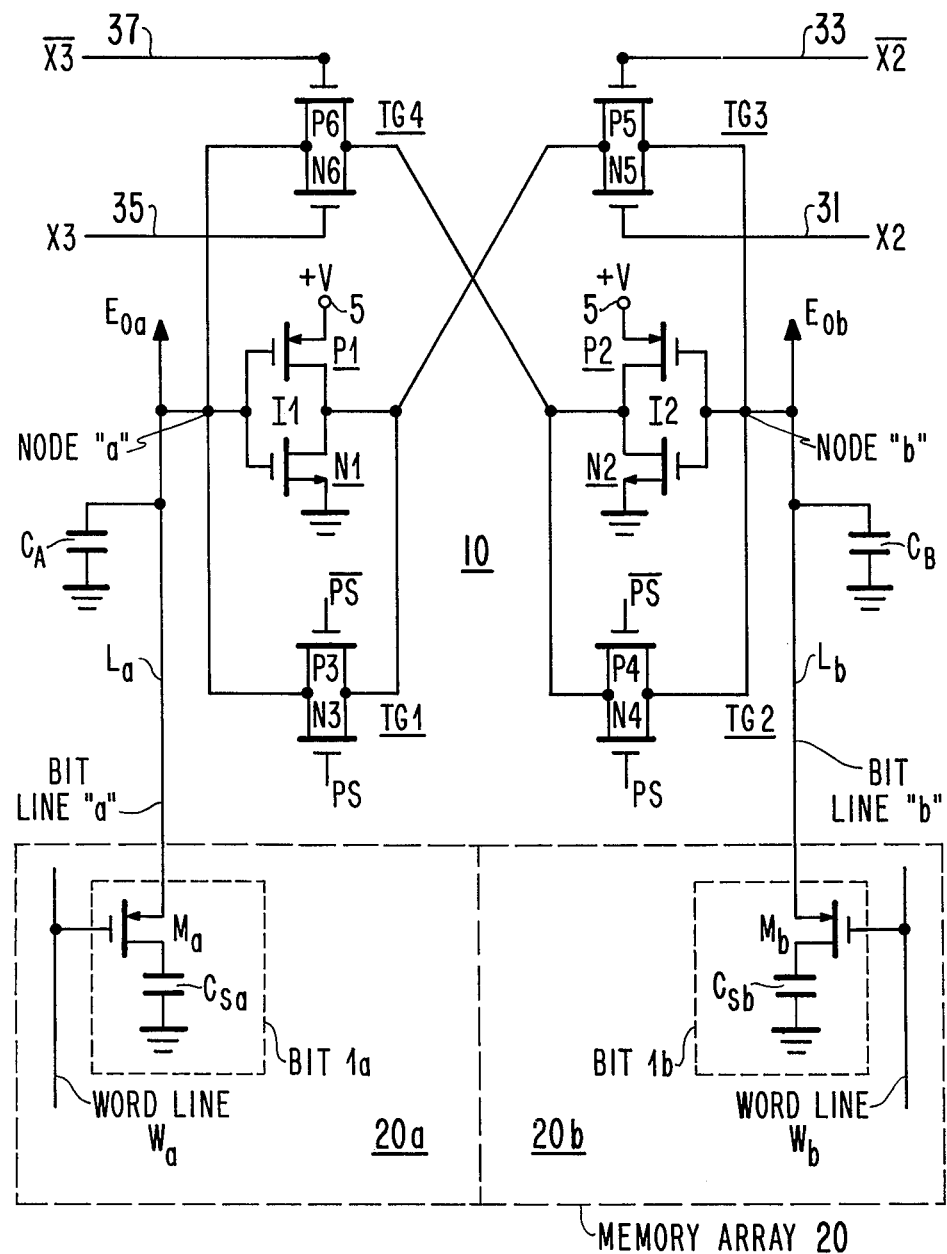
FIG. 2 is a schematic diagram of a sense circuit embodying the invention.

The circuit of FIG. 2 includes a sense circuit 10 which senses the information contained in a memory array 20 whose data bits are divided into two parts 20a, 20b. The bits in part 20a are selectively coupled to bit line La (node "a") and the bits in part 20b are selectively coupled to bit line Lb (node "b"). When part 20a of memory 20 is coupled to La, part 20b functions as a dummy load and, vice versa, when part 20b is read out onto Lb, part 20a functions as a dummy load. For ease of illustration, only one cell or bit (1a and 1b) from each part of memory 20 is shown. Each cell includes a switching transistor (Ma, Mb) and a storage capacitor ($C_{Sa}$, $C_{Sb}$). The gate of each switching transistor is connected to a word line (Wa, Wb) having a like alphabetic subscript and its source-to-drain path is connected between one side of data storage capacitor ($C_{Sa}$, $C_{Sb}$) and a bit line (La, Lb) having a like subscript. Transistors Ma, Mb, which are P-type IGFETs, are turned on when their gates are driven to ground. They then transfer the charge (data) stored on their associated storage capacitors to the corresponding nodes "a" or "b".

The signals applied to nodes "a" and "b" are sensed by Sense Circuit 10 which includes two complementary inverters (I1, I2) and four complementary transistor transmission gates (TG1, TG2, TG3, and TG4).

Each one of inverters I1 and I2 includes an insulated-gate field-effect transistor (IGFET) of N conductivity type (N1, N2) and an IGFET of P conductivity (P1, P2). The source electrodes of IGFETs P1 and P2 are connected to terminal 5 to which is applied +V volts while the source electrodes of IGFETs N1 and N2 are connected to ground. The drain electrodes of the two IGFETs of an inverter are connected to its output, and the gate electrodes of the two IGFETs of an inverter are connected to its input. Inverter I1 is connected at its input to node "a" and inverter I2 is connected at its input to node "b".

Each transmission gate includes two IGFETs of complementary conductivity type having their source-to-drain paths, which define the conduction path of the transmission gate, connected in parallel. Biasing transmission gate TG1, comprising transistor P3 and N3, selectively connects the input of inverter I1 to its output. Biasing transmission gate TG2, comprising transistors P4 and N4, selectively connects the input of inverter I2 to its output. Complementary precharge signals PS and $\overline{PS}$ are applied to the gate electrodes of the N and P transistors, respectively, of gates TG1 and TG2. Gates TG1 and TG2 are enabled when PS is high (+V) and $\overline{PS}$ is low (ground or zero volts).

Cross coupling transmission gate TG3, comprising transistors P5 and N5, selectively connects the output of inverter I1 to node "b", and cross coupling transmission gate TG4, comprising transistors P6 and N6, selectively connects the output of inverter I2 to node "a".

Signal lines 31 and 33, to which are applied complementary signals X2 and $\overline{X2}$, respectively, are connected to the gate electrodes of transistors N5 and P5, respectively. Signal lines 35 and 37, to which are applied complementary signals X3 and $\overline{X3}$ respectively, are connected to the gate electrodes of transistors N6 and P6, respectively. Gate TG3 is enabled when X2 is high ($\overline{X2}$ low), and gate TG4 is enabled when X3 is high ($\overline{X3}$ low). Applying different signals (X2, X3) to the cross coupling gates enables their turn on to be sequenced.

Figure 3:
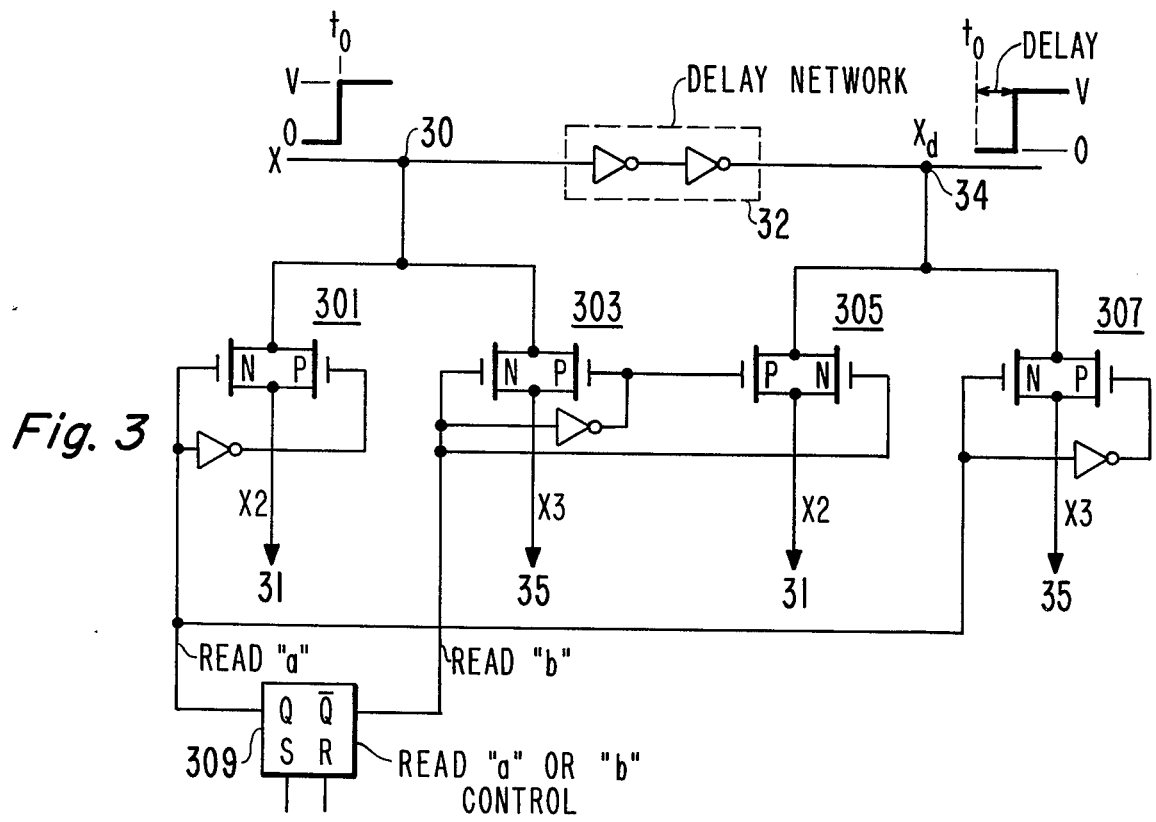
FIG. 3 is a schematic diagram of a sequencing arrangement for use with the circuit of FIG. 2.

FIG. 3 includes circuitry for selectively turning on TG3 before TG4 or selectively turning on TG4 before TG3. A signal X which goes from 0 volts to +V volts when the cross coupling gates are to be turned on is applied to a node 30. A delay network 32, comprised of two cascaded inverters, is connected at its input to node 30 and at its output to node 34 at which is produced X-delayed ($X_d$). The delay network could take a variety of forms other than that shown in FIG. 3. The delay may be increased and controlled by numerous methods (not shown), such as increasing the number of cascaded inverters or by inserting an RC network in the signal path.

The signal X is applied to the input of transmission gates 301, 303, whose outputs are connected to lines 31 and 35, respectively. $X_d$ is applied to the input of transmission gates 305, 307 whose outputs are connected to lines 31 and 35, respectively. The enabling and disabling of gates 301, 303, 305 and 307 is controlled by a READ "a" or "b" control network 309. When part "a" of the memory is to be read out, network 309 enables gates 301 and 307 and disables gates 303 and 305. The output of gate 301, X2, goes positive before the output of gate 307, X3, and TG3 turns on before TG4. When part "b" of memory 20 is to be read out, network 309 enables gates 303 and 305 and disables gates 301 and 307. X3 then goes positive before X2 and TG4 turns on before TG3. The complementary signals X2 and X3 may be produced from X2 and X3 by known inversion circuitry which, for purpose of clarity, is not shown.

The operation of the sense circuit during a READ cycle is now explained. Each "read" cycle includes a precharge period, followed by a period during which new information is sensed, and finally a latch period during which the sense circuit functions as a flip flop and stores the sensed information while restoring or rewriting information back into the sensed cell.

Just prior to reading out the contents of array 20, a precharge period is initiated by PS going high and $\overline{PS}$ goes low enabling gates TG1 and TG2. At that time, cross coupling gates TG3 and TG4 are disabled. When gates TG1 and TG2 are enabled, inverters I1 and I2 are "self-biased" in the linear portion of their transfer characteristics and function as linear amplifiers. An inherent characteristic of the complementary IGFET inverters is that, due to the extremely high input impedance of the IGFETs the current between the inverter outputs and inputs is negligible. For the self-bias condition, there is substantially no voltage drop across TG1 or TG2 and the inverter — amplifiers are biased in the linear region at the point at which their output voltage ($V_O$) is equal to their input voltage ($V_{IN}$). The operating point or quiescent point ($V_Q$) of a complementary inverter for the "self-bias" arrangement occurs at the intersection of its transfer curve and a line satisfying the equation $V_O = V_{IN}$.

The shape of the transfer curve of a complementary inverter is dependent on the characteristics of the N and P transistors forming the inverters. The $V_Q$ of a self-biased complementary inverter (i.e., one with no external input signal applied) is a function of the relative channel impedances of its P and N transistors. The impedance (Z) of each transistor is in turn a function of the ratio of its channel length (L) to its channel width (W), $[Z = f(L/W)]$.

For the circuit of FIG. 2, assume that the quiescent points $V_{Q1}$ and $V_{Q2}$ of inverters I1 and I2, are equal to each other and equal to V/2. Each inverter then charges the sense line to which its input is directly connected, via its enabled biasing gate, to the value $V_Q$ at its output. Thus, capacitances $C_A$ and $C_B$ at nodes "$a$" and "$b$" are charged to V/2 volts at the termination of the precharge cycle.

The precharge period is terminated by disabling gates TG1 and TG2 (PS and $\overline{PS}$ go low and high, respectively).

A sense period is then initiated during which the state of a selected device is sensed. Assume now, that $W_a$ is driven low turning on transistors Ma and that Mb remains high keeping transistor Mb turned off. The charge on $C_{Sa}$ is then coupled to node "$a$" while node "$b$" remains at V/2.

The operation of the circuit will first be discussed for the condition when $C_{Sa}$ is charged to the high level (+V volts), arbitrarily defined as logic 1, and then for the condition when $C_{Sa}$ is charged to the low level (zero volts) arbitrarily defined as logic "0".

When $C_{Sa}$ is charged to +V volts and transistor Ma is turned on, the positive charge on $C_{Sa}$ causes the potential on bit line $a$ ($V_A$) to go more positive than its precharge value. As soon as transistor Ma is turned on, charge redistribution occurs between $C_{Sa}$ and the nodal capacitance $C_A$. Where, for example, as before, $C_A$ is ten times greater than $C_{Sa}$, the change in voltage, $\Delta V$, at node $a$ is approximately V/20 and $V_A$ goes to [V/2 + $\Delta V$] volts. The net change in voltage at node $a$, $\Delta V$ is relatively small but it causes a perceptible change in the steady state value (V/2) or precharge value established at node $a$.

In contrast, when $C_{Sa}$ is storing a 0 and transistor Ma is turned on, the precharge value of V/2 is decreased by V/20 and the potential at node $a$ is then equal to [V/2 − $\Delta V$] volts or V/2 minus V/20.

During the sensing of a data bit, inverters I1 and I2 function as sensitive high gain amplifiers. At the end of the sensing period, for the assumed condition of line "$a$" being accessed; the output of inverter I1 will, depending on the value of the sensed data bit, be either [$V_{Q1} − G_1 \Delta V$] or [$V_{Q1} + G_1 \Delta V$] while the output of inverter I2 remains at $V_{Q2}$; where G1 is the voltage gain of inverter I1.

Following the sense period, the inverters are cross coupled, but a serious problem exists if the inverters are cross coupled without regard to which of its input lines was accessed. The net change in signal, $\Delta V$, at the sensing node is relatively small. This small signal can be less than the imbalance of the capacitance ($C_A$, $C_B$) at nodes $a$ and $b$ or the mismatch in the quiescent points ($V_{Q1}$, $V_{Q2}$) of inverters I1 and I2. Although it has been assumed, for purpose of illustration, that $V_{Q1}$ is equal to $V_{Q2}$ that may not always be the case. Similarly the nodal capacitances ($C_A$, $C_B$) may not always be equal. If the difference between $V_{Q1}$ and $V_{Q2}$ and/or $C_A$ and $C_B$ is equal to or greater than the signal change in a direction to cancel or mask the signal change and if, for example, the output of inverter I2 were coupled to node $a$ and the input of inverter I1, even an instant prior to the coupling of the output of inverter I1 to the input of inverter I2, then the inverters could latch to an erroneous condition.

Therefore, if gates TG3 and TG4 were turned on simultaneously, the signal produced at a sensing node ($a$ or $b$) could be lost. This problem is solved in the circuit of the invention by sequencing the turn on of the cross coupling gates.

The turn on sequence of transmission gates TG3 and TG4 is made to depend on whether the selected memory cell is connected to bit line $a$ or bit line $b$. If the accessed memory cell is connected to bit line $a$, then TG3 is turned on first followed by the turn on of gate TG4. Otherwise, if the accessed memory cell is connected to bit line $b$, TG4 is turned on before TG3. Assume that a memory cell has been read out on line "$a$". Enabling TG3 before TG4 causes the signal at node $a$ which is amplified (and inverted) through inverter I1 to be applied to node $b$ and to the input of inverter I2 before permitting any coupling from node $b$ back through TG4 to affect the potential at node $a$. Recall that at the end of the precharge period, the biasing gates are turned off; each inverter is then biased to its trip point ($V_{Q1}$, $V_{Q2}$), and is operated in the high gain region of its transfer characteristic. Then, during the sense period, a data signal equal to (±) $\Delta V$ is applied to the input (node $a$) of inverter I1 while the input (node $b$) of inverter I2 remains at its quiescent level. Inverter I1 amplifies and inverts the signal (±$\Delta V$) applied to its input, producing at its output a signal G1 [(±) $\Delta V$]; where G1 is greater than 1. Making [G1 · $\Delta V$] greater than the largest possible imbalance that can exist between $V_{Q1}$ and $V_{Q2}$ and between $C_A$ and $C_B$ ensures correct read out. Enabling TG3 first, couples the output of inverter I1 to node $b$ and actively drives node $b$ to the level at the output of I1.

The signal applied to node $b$ is amplified and inverted by inverter I2 which in turn produces at its output a signal in-phase with, and of significantly greater amplitude than, the data signal originally applied to node a. Thus, when TG4 is subsequently enabled, the signal positively fed back to node a is unquestionably in phase with the signal originally present at node a. Following the turn on of TG4 the two cross coupled inverters form a flip flop whose state is unquestionably controlled by the data signal originally at node a. Needless to say, when a memory cell is read out onto line b, TG4 is turned on first and subsequently TG3 is turned on. As above, the signal at node b then clearly determines the subsequent state of the latched flip flop. Sequencing the turn on of cross coupling gates TG3 and TG4 eliminates the possibility of errors resulting from capacitance imbalance between nodes a and b or due to mismatch between inverters I1 and I2. The important feature is that the signal at the selected node is first amplified and then coupled to the opposite non-selected node to ensure that the signal condition at the selected node predominates in the setting of the flip flop. As discussed, this feature ensures correct read-out of the sensed information.

The use of complementary inverters enables the non-destructive read-out of memory cells. Since the operation of the circuit is symmetrical, description of the operation at one node is deemed sufficient.

Following the turn on of the two cross coupling gates, node a will either be clamped to +V volts or to ground corresponding to a "1" or a "0" having been read out.

When node a is clamped to +V volts, node b is clamped to ground. Transistor P2 is then fully turned on and conducts in the common source mode while transistor N2 is turned off and there is no load between the drain of transistor P2 and ground. Consequently, the output of inverter I2 is clamped to +V volts via the low impedance conduction path of transistor P2. Gate TG4 is enabled with transistor P6 conducting in the common source mode and providing a low impedance path between the drain of transistor P2 and node a. Hence, node a is clamped to +V volts via the low impedance conduction paths of transistors P2 and P6. Thus, the full +V volt level is established at node a and can be rewritten via transistor Ma into charge storage capacitor $C_{Sa}$.

When node a is at ground potential node b is at +V volts. Transistor P2 is then turned off and transistor N2 is turned on and conducts in the common source mode clamping the output of inverter I2 via its low impedance conduction path to ground. Concurrently, transistor N6 in gate TG4 also conducts in the common source mode and provides a low impedance conduction path between node a and the output of inverter I2. Consequently, node a is clamped to ground via the low impedance series paths of transistors N6 and N2.

It should be evident that inverter I1 and the transistors of gate TG3 function to clamp node b to +V volts or ground in a similar manner to that just described for inverter I2 and TG4.

Thus, complementary inverters I1 and I2 enable the restoration of voltage levels at nodes a and b, necessary to rewrite into the charge storage capacitor $C_{Sa}$ the information it originally stored. The information on line a is coupled to $C_{Sa}$ via switching transistor Ma.

Thus, when the circuit of FIG. 2 is in the latch condition, there is always a low impedance conduction path, comprised of two series connected transistors operated in the common source mode, clamping nodes a and b to one or the other of the two power supply lines.

It should be appreciated that the transmission gates TG3 and TG4 could be replaced by transistors of signal conductivity type. However, to get the benefit of the complementary inverters, the gates of these transistors have to be overdriven in order to ensure no voltage offset across their conduction paths.

What is claimed is:

1. A sense amplifier comprising:
   first and second nodes;
   means for applying signals to said first and second nodes;
   first and second inverters, each inverter having an input, an output, and first and second power terminals for the application thereto of first and second operating voltages, respectively; each inverter comprising respective first and second transistors of complementary conductivity type and being responsive to a first level at its input for clamping its output to the voltage at said first power terminal via its first transistor conducting in the common source mode, and being responsive to a second level at its input for clamping its output to the voltage at said second power terminal via its second transistor conducting in the common source mode;
   means connecting the input of said first inverter to said first node, and means connecting the input of said second inverter to said second node;
   a first biasing means connected between the input and the output of said first inverter, and a second biasing means connected between the input and the output of said second inverter, said first and second biasing means for selectively providing a direct current connection between the input and output of each one of said first and second inverters and biasing them at first and second quiescent points, respectively; and
   first and second selectively enabled cross coupling means; said first cross coupling means, when enabled, for coupling the output of said first inverter to said second node via a low impedance path which includes first transistor means conducting in the common source mode under all signal conditions, and said second cross coupling means, when enabled, for coupling the output of said second inverter to said first node via a low impedance path which includes second transistor means conducting in the common source mode under all signal conditions,.

2. The sense amplifier claimed in claim 1 wherein said first transistor means is a first complementary transistor transmission gate connected between the output of said first inverter and said second node; and
   wherein said second transistor means is a second complementary transistor transmission gate connected between the output of said second inverter and said first node.

3. The combination comprising:
   first and second nodes;
   means for applying signals to said first and second nodes;
   first and second inverters, each inverter having an input, an output;
   means connecting the input of said first inverter to said first node, and means connecting the input of said second inverter to said second node;
   a first biasing means connected between the input and the output of said first inverter, and a second biasing means connected between the input and the output of said second inverter, said first and second biasing means for selectively providing a direct current connection between the input and output of each one of said first and second inverters and biasing them at first and second quiescent points, respectively; and first and second selectively enabled cross coupling means, said first cross coupling means for coupling the output of said first inverter to said second node via a low impedance path, when enabled, and said second cross coupling means for coupling the output of said second inverter to said first node via a low impedance path, when enabled; said first and second selectively enabled cross coupling means including means for sequencing the enabling of said cross coupling means.

4. The combination as claimed in claim 3 wherein said means for applying signals to said first and second nodes, includes means for applying a signal to one of said first and second nodes at a time, and wherein said means for sequencing the turn on of said cross coupling include means responsive to the application of a signal to said one of said first and second nodes for first enabling the cross coupling means connected between the output of the inverter whose input is connected to said one node and for subsequently enabling the other cross coupling means.

5. The combination as claimed in claim 4 wherein each one of said cross-coupling means includes two transistors of complementary conductivity having their conduction paths connected in parallel.

6. The combination as claimed in claim 5 wherein said inverter transistors and said cross coupling transistors are insulated-gate field-effect transistors.

7. The combination as claimed in claim 3 wherein each one of said first and second inverters, also has first and second power terminals for the application thereto of first and second operating voltages, respectively; and wherein each inverter comprises first and second transistors of complementary conductivity type and is responsive to a first level at its input for clamping its output to the voltage at said first power terminal, and is responsive to a second level at its input for clamping its output to the voltage at said second power terminal.

8. A method of operating a sense amplifier having first and second input nodes to which signals are applied one at a time, said sense amplifier also having: (a) first and second inverters connected at their inputs to said first and second input nodes, respectively, (b) a selectively enabled biasing gate connected between the input and the output of each inverter for, when enabled, biasing each inverter input and its associated input node to the quiescent point of the inverter; and (c) first and second cross coupling transmission gates, said first gate being connected between the output of said first inverter and said second node and said second gate being connected between the output of said second inverter and said first node, comprising the steps of:

first enabling said biasing gates and then disabling said biasing gates;

then applying a signal to one of said first and second input nodes; and then enabling that one of said first and second cross coupling gates connected to the output of the inverter to whose input a signal is applied, and then subsequently enabling the other one of said first and second cross coupling gates.

* * * * *

UNITED STATES PATENT AND TRADEMARK OFFICE
CERTIFICATE OF CORRECTION

PATENT NO. : 4,107,556

DATED : August 15, 1978

INVENTOR(S) : Roger G. Stewart et al

It is certified that error appears in the above-identified patent and that said Letters Patent is hereby corrected as shown below:

Column 4, line 66 "X2 and X3" should be --- $\overline{X2}$ and $\overline{X3}$ ---.

Signed and Sealed this

Nineteenth Day of June 1979

[SEAL]

Attest:

RUTH C. MASON
*Attesting Officer*

DONALD W. BANNER
*Commissioner of Patents and Trademarks*